(12) United States Patent
Chang et al.

(10) Patent No.: US 9,652,228 B2
(45) Date of Patent: May 16, 2017

(54) DEVICES AND OPERATION METHODS FOR CONFIGURING DATA STROBE SIGNAL IN MEMORY DEVICE

(71) Applicant: Macronix International Co., Ltd., Hsinchu (TW)

(72) Inventors: Kuen-Long Chang, Taipei (TW); Ken-Hui Chen, Hsinchu (TW); Chang-Ting Chen, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 225 days.

(21) Appl. No.: 14/677,321

(22) Filed: Apr. 2, 2015

(65) Prior Publication Data

US 2015/0286405 A1 Oct. 8, 2015

Related U.S. Application Data

(60) Provisional application No. 61/974,459, filed on Apr. 3, 2014.

(51) Int. Cl.
*G06F 12/00* (2006.01)
*G06F 9/00* (2006.01)

(52) U.S. Cl.
CPC .................... *G06F 9/00* (2013.01)

(58) Field of Classification Search
CPC ...... G06F 3/061; G06F 3/0634; G06F 3/0679; G06F 9/00
USPC ....................................................... 711/154
See application file for complete search history.

(56) References Cited

U.S. PATENT DOCUMENTS

| 6,539,072 | B1 | 3/2003 | Donnelly et al. |
| 7,590,879 | B1 * | 9/2009 | Kim .................... G06F 13/4243 713/400 |
| 2005/0138457 | A1 | 6/2005 | Gomm et al. |
| 2005/0140416 | A1 | 6/2005 | Rashid |
| 2014/0016404 | A1 | 1/2014 | Kim et al. |

FOREIGN PATENT DOCUMENTS

WO    WO 2005/064616 A1    7/2005

* cited by examiner

*Primary Examiner* — Matthew Bradley
(74) *Attorney, Agent, or Firm* — Finnegan, Henderson, Farabow, Garrett & Dunner LLP (57) ABSTRACT

A non-volatile memory device includes a memory core storing data to be output from the memory core according to an external clock signal, an input buffer receiving the external clock signal and providing an input clock signal, and a synchronization circuit including a delay circuit and configured to receive the input clock signal, provide an output clock signal, and synchronize the output clock signal to the external clock signal. The device further includes a data strobe output buffer receiving the output clock signal and providing a data strobe signal having a signal delay configurable relative to the external clock signal, a clocked circuit element receiving the data and the output clock signal and outputting the data in synchronism with the output clock signal, and a delay control circuit providing a delay control signal to the delay circuit to modify the signal delay of the data strobe signal.

19 Claims, 9 Drawing Sheets

DEVICES AND OPERATION METHODS FOR CONFIGURING DATA STROBE SIGNAL IN MEMORY DEVICE

CROSS-REFERENCE TO RELATED APPLICATIONS

This application is based upon and claims the benefit of priority from Provisional Application No. 61/974,459, filed on Apr. 3, 2014, the entire contents of which are incorporated herein by reference.

TECHNOLOGY FIELD

The present disclosure generally relates to devices for configuring data strobe signal in non-volatile memory devices.

BACKGROUND

A non-volatile memory, such as a flash memory, is a semiconductor device, which retains its stored data even if it is powered off. Flash memory devices offer fast read access time and better shock resistance compared to hard disks. As a result, flash memory devices are popular in various applications, such as data storage on computing devices, mobile phones, portable audio players, and other consumer electronic products.

Some non-volatile memory devices operate in synchronism with an external clock provided by a memory controller. In such synchronous configuration, a data strobe signal may be used to indicate that data stored in a non-volatile memory device is available for access.

Figure 1:
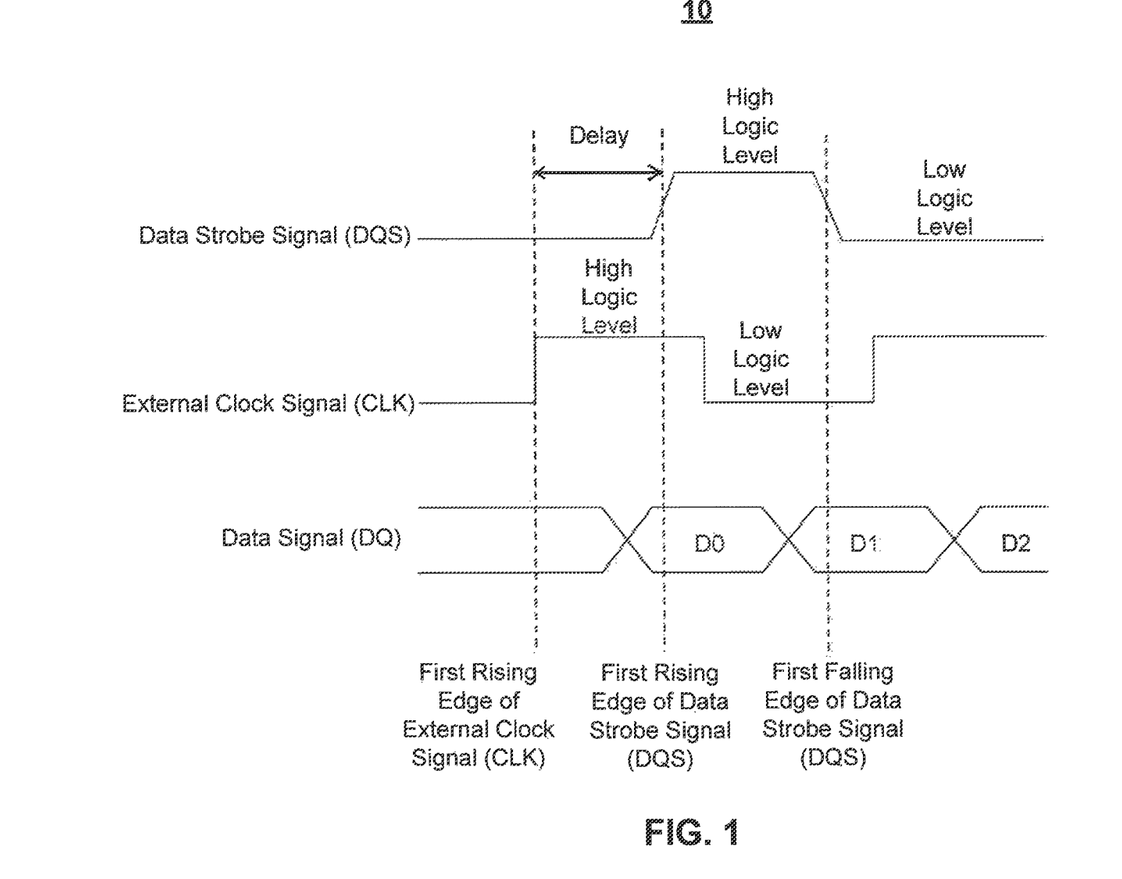
FIG. 1 is a signal diagram illustrating a synchronous data transfer for a non-volatile memory device.

FIG. 1 shows a signal diagram 10 of a read operation for a non-volatile memory device. Signal diagram 10 illustrates a data strobe signal DQS synchronized to an external clock signal CLK for accessing a data signal DQ. A rising edge of the data strobe signal DQS is synchronized to a high logic level of the external clock signal CLK. A falling edge of the data strobe signal DQS is synchronized to a low logic level of the external clock signal CLK. Referring to the data strobe signal DQS and the data signal DQ, the first rising edge of the data strobe signal DQS indicates that a first bit (D0) of the data signal DQ is available for access. The first falling edge of the data strobe signal DQS indicates that a second bit (D1) of the data signal DQ is available for access.

Although a delay exists between the first rising edge of the data strobe signal DQS and the first rising edge of the external clock signal CLK, the data strobe signal DQS and the external clock signal CLK remain synchronized. That is, the data strobe signal DQS rises to a high logic level when the external clock signal CLK is at a high logic level. By synchronizing the data strobe signal DQS to the external clock signal CLK, the data signal DQ can be transferred with minimal error because the data strobe signal DQS, synchronized with the external clock CLK, appropriately indicates an availability of the data signal DQ.

Figure 2:
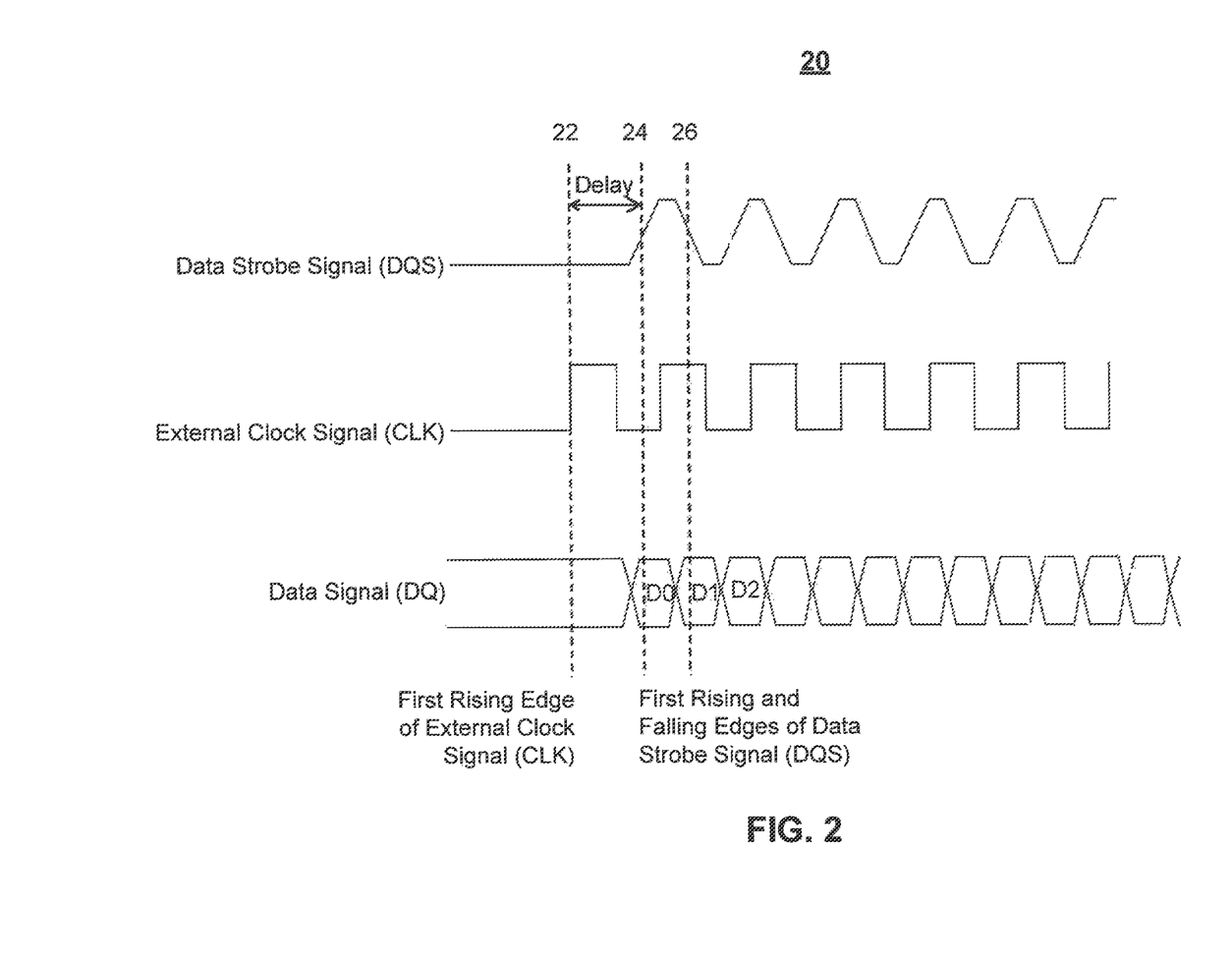
FIG. 2 is a signal diagram illustrating a data transfer for a non-volatile memory device having an increased external clock speed.

However, as the speed or frequency of the external clock CLK continues to increase to achieve a higher rate of data transfer, the delay between the first rising edge of the data strobe signal DQS and the first rising edge of the external clock signal CLK becomes significant. FIG. 2 shows a signal diagram 20 of a data transfer of a read operation for a non-volatile memory device having an increased external clock speed. FIG. 2 denotes a first rising edge 22 of the external clock signal CLK, and first rising 24 and falling 26 edges of the data strobe signal DQS. A delay between first rising edge 24 of the data strobe signal DQS and first rising edge 22 of the external clock signal CLK is longer than the first high logic level of the external clock signal CLK. Because of the delay, first rising edge 24 of the data strobe signal DQS is no longer synchronized to the high logic level of the external clock signal CLK. For the same reason, falling edge 26 of the data strobe signal DQS is also not synchronized to a low logic level of the external clock signal CLK. Such delay may cause data transfer errors. The delay can be further exacerbated by unmatched loading/routing between DQ and DQS signal paths and/or simultaneous switching noise (caused by simultaneous switching of multiple buffers/inverters) on DQ or DQS signal lines. Additionally, the delay of the data strobe signal DQS relative to the external clock signal CLK may also be affected by various factors, such as operating temperature, operating voltage, and fabrication processes.

SUMMARY

According to an embodiment of the disclosure, there is provided a non-volatile memory device including a memory core, an input buffer, a synchronization circuit, a data strobe output buffer, a clocked circuit element, and a delay control circuit. The memory core stores data, which is output from the memory core according to an external clock signal. The input buffer receives the external clock signal and provides an input clock signal. The synchronization circuit receives the input clock signal and provides an output clock signal, and synchronizes the output clock signal to the external clock signal. The synchronization circuit includes a delay circuit. The data strobe output buffer receives the output clock signal and provides a data strobe signal indicating the data output from the memory core is available for access. The data strobe signal has a signal delay configurable relative to the external clock signal. The clocked circuit element is coupled to receive the data output from the memory core and the output clock signal and to output the data in synchronism with the output clock signal. The delay control circuit provides a delay control signal to the delay circuit. The delay circuit is responsive to the delay control signal to modify the signal delay of the data strobe signal.

According to another embodiment of the disclosure, there is provided a circuit to synchronize clock signals. The circuit includes a synchronization circuit, a strobe output buffer, and a delay control circuit. The synchronization circuit receives an input clock signal and provides an output clock signal, and synchronizes the output clock signal to an external clock signal. The synchronization circuit includes a delay circuit. The strobe output buffer receives the output clock signal and provides a strobe signal. The strobe signal has a signal delay configurable relative to the external clock signal. The delay control circuit provides a delay control signal to the delay circuit. The delay circuit is responsive to the delay control signal to modify the signal delay of the strobe signal.

According to another embodiment of the disclosure, there is provided a circuit to synchronize clock signals. The circuit includes an input buffer, a synchronization circuit, a strobe output buffer, and a delay control circuit. The input buffer receives an external clock signal and provides an input clock signal. The input buffer has a first delay length. The synchronization circuit receives the input clock signal and provides an output clock signal, and synchronizes the output clock signal to the external clock signal. The synchronization circuit includes a delay circuit having a second delay length and a configurable delay length, a forward delay line having a third delay length, a backward delay line having a fourth delay length, a mirror control circuit to match the fourth delay length to the third delay length, and an internal buffer having a fifth delay length. A sum of the first, second, third, fourth, and fifth delay lengths is an integer multiple of a duration of a full clock cycle of the external clock signal. The strobe output buffer receives the output clock signal and provides a strobe signal. The strobe signal has a signal delay configurable relative to the external clock signal. The delay control circuit provides a delay control signal to the delay circuit of the synchronization circuit. The delay circuit is responsive to the delay control signal to adjust the configurable delay length of the delay circuit to modify the signal delay of the strobe signal.

According to another embodiment of the disclosure, there is provided a method for configuring a signal delay in a non-volatile memory device. The method includes receiving an external clock signal, and providing a data strobe signal indicating data stored in the non-volatile memory is available for access. The data strobe signal has a signal delay configurable relative to the external clock signal. The method further includes providing a memory operation command to the non-volatile memory device to modify the signal delay.

Features and advantages consistent with the disclosure will be set forth in part in the description which follows, and in part will be obvious from the description, or may be learned by practice of the disclosure. Such features and advantages will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate several embodiments.

DESCRIPTION OF EXAMPLE EMBODIMENTS

Reference will now be made in detail to the example embodiments, which are illustrated in the accompanying drawings.

Figure 3:
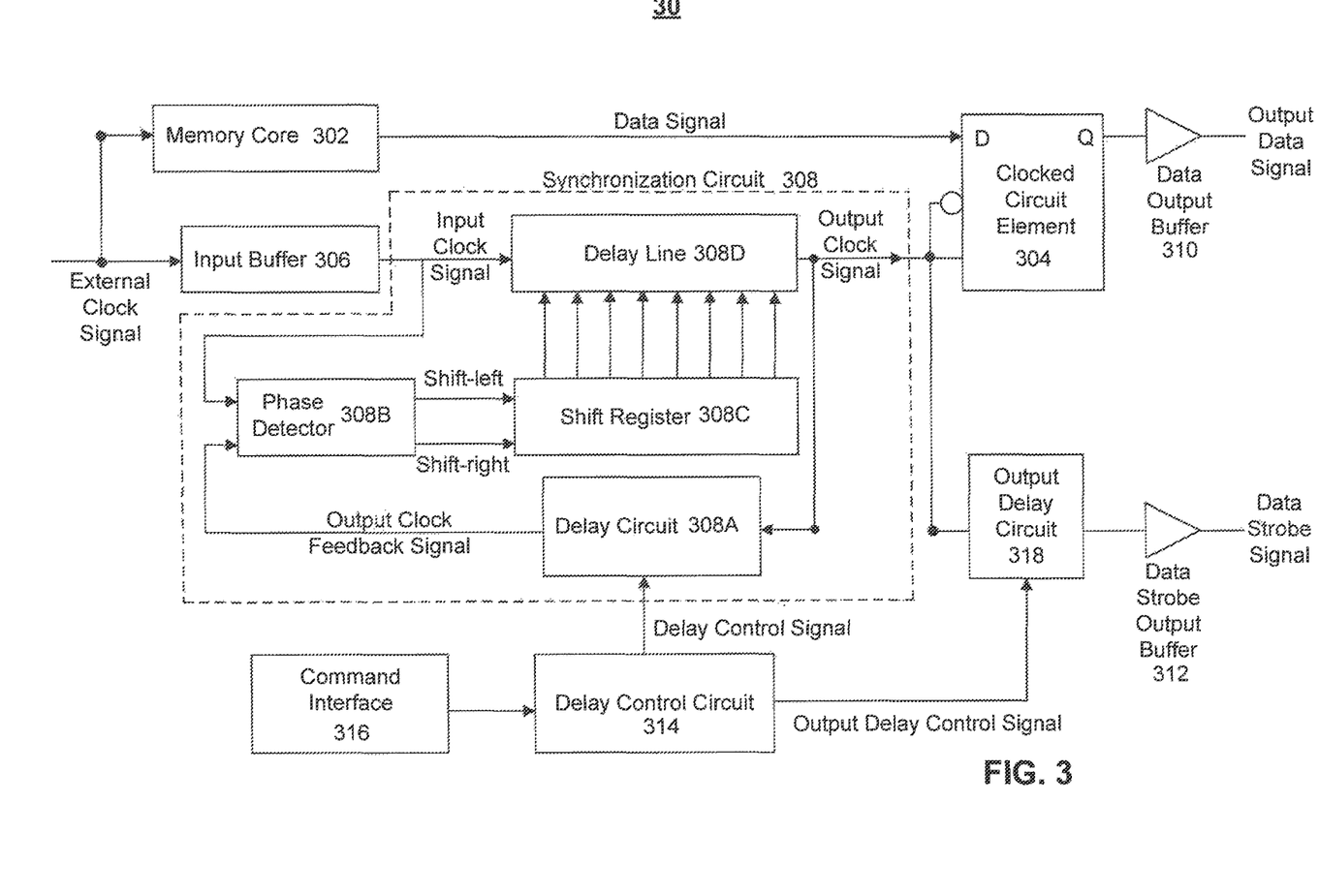
FIG. 3 shows an exemplary non-volatile memory device consistent with embodiments of this disclosure.

Reference is now made to FIG. 3, which shows an example non-volatile memory device 30. Device 30 includes a memory core 302, a clocked circuit element 304, an input buffer 306, a synchronization circuit 308, a data output buffer 310, a data strobe output buffer 312, and a delay control circuit 314.

Memory core 302 includes a memory array, a logic control unit, a row address decoder, a column address decoder, and sense amplifiers. The memory array includes multiple memory cells arranged in rows and columns. The memory cells in the same row are connected by a word line, and the memory cells in the same column are connected by a bit line. The sense amplifiers are coupled to the bit lines. The logic control unit, synchronized to an external clock signal or operating based on an internal oscillator, controls various memory operations based on a memory operation command (e.g., a memory read or write command) and an address signal.

During a memory read operation, the row and column decoders, coupled to the word lines and bit lines, respectively, decode the address signal to select (address) the memory cells to be accessed or read. Subsequently, the sense amplifiers amplify and transmit from memory core 302 the data signal, read from the accessed memory cell, to clocked circuit element 304.

Input buffer 306 receives the external clock signal and provides an input clock signal to synchronization circuit 308. Input buffer 306 may, for example, be one or more inverters, or an operational amplifier that restores logic levels (voltage levels) of the external clock signal that are lost due to impedance. Subsequently, synchronization circuit 308 provides an output clock signal. Clocked circuit element 304 receives the data signal from memory core 302 and the output clock signal from synchronization circuit 308. Clocked circuit element 304 then provides the data signal to data output buffer 310 at the rising and falling edges of the output clock signal. That is, the data signal provided by the clocked circuit element 304 is synchronized with the output clock signal. After receiving the data signal from clocked circuit element 304, data output buffer 310 provides an output data signal corresponding to the data signal received from clocked circuit element 304 and synchronized with the output clock signal. Further, data strobe output buffer 312 receives the output clock signal from synchronization circuit 308, and provides a data strobe signal synchronized with the output clock signal. Because the data strobe signal and the output data signal are both synchronized to the output clock signal, the data strobe signal indicates that the output data signal is available for a read access.

Synchronization circuit 308 includes a delay circuit 308A, which receives the output clock signal and provides an output clock feedback signal. Delay circuit 308A also receives a delay control signal provided by delay control circuit 314.

In some embodiments, synchronization circuit 308 further includes a phase detector 308B, a shift register 308C, and a delay line 308D. Phase detector 308B detects a phase difference between the input clock signal and the output clock feedback signal. According to the detected phase difference, phase detector 308B provides a control signal ("shift-left" or "shift-right") to control shift register 308C, which subsequently determines a delay length of delay line 308D, for removing the detected phase difference between the input clock signal and the output clock feedback signal.

In some embodiments, delay circuit 308A receives the delay control signal provided by delay control circuit 314 to modify a delay duration of the data strobe signal. In some embodiments, a command interface 316 is coupled to delay control circuit 314, and provides a delay control signal to delay control circuit 314. In some embodiments, device 30 further includes an output delay circuit 318 coupled between synchronization circuit 308 and data strobe output buffer 312. Instead of receiving the delay control signal, output delay circuit 318 receives an output delay control signal provided by delay control circuit 314. Output delay circuit 318 and the output delay control signal may be substantially similar to delay circuit 308A and the delay control signal, respectively. Based on the output delay control signal, output delay circuit 318 modifies a delay duration of the data strobe signal relative to the output data signal.

Figure 4A:
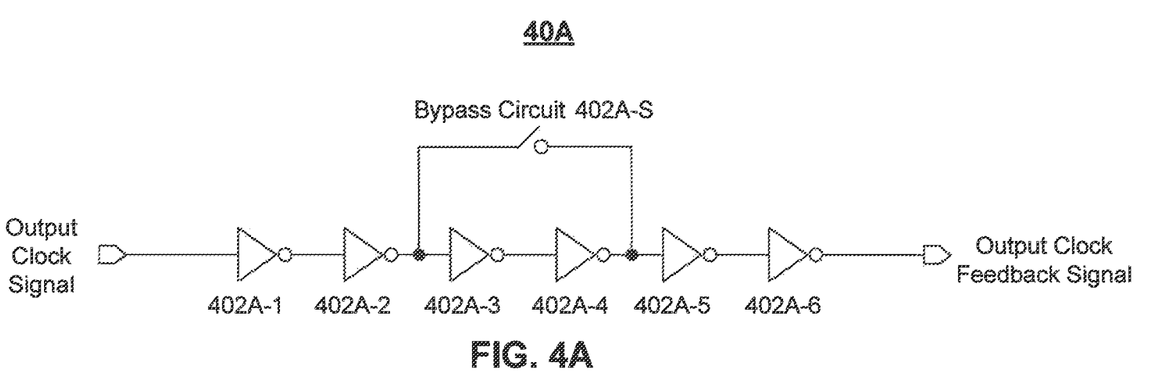
FIGS. 4A and 4B shows exemplary delay circuits consistent with embodiments of this disclosure.
Figure 4B:
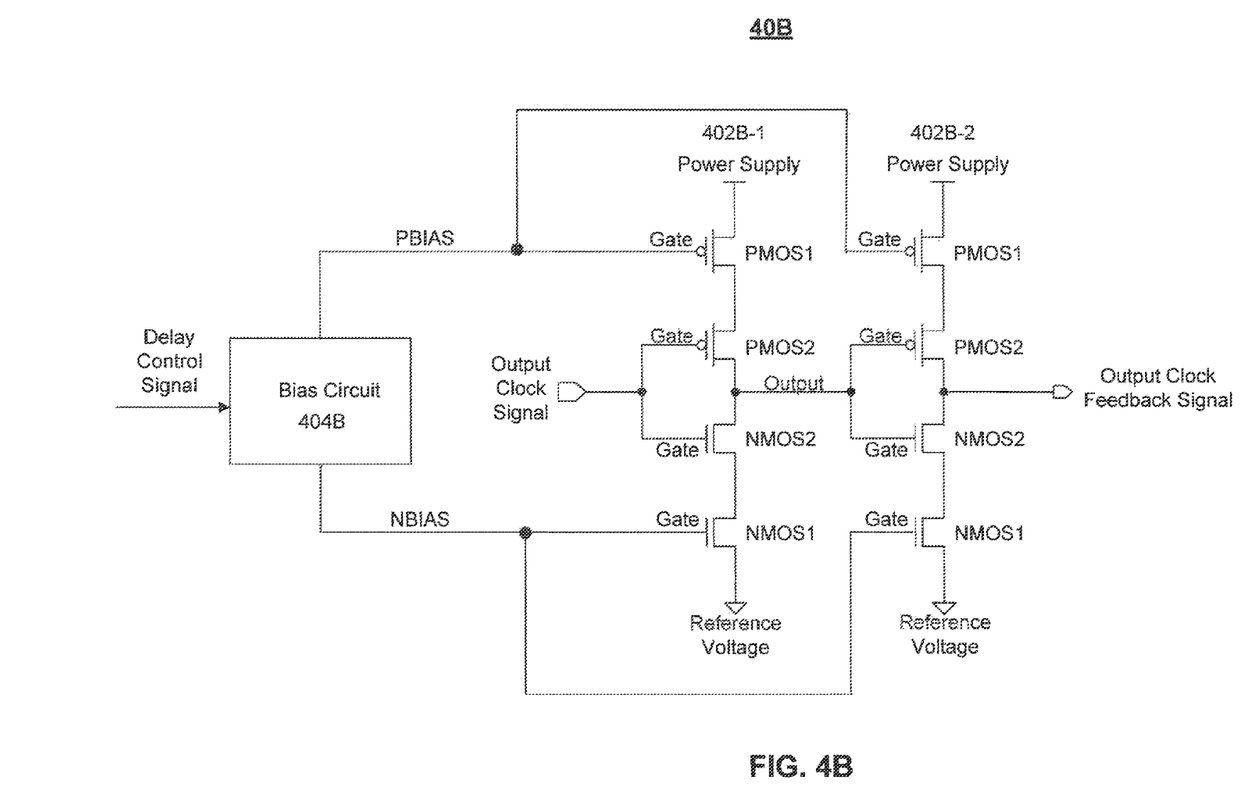

FIGS. 4A and 4B show examples of delay circuit 308A. As discussed above, output delay circuit 318 may be substantially similar to delay circuit 308A. Thus, the examples in FIGS. 4A and 4B are also descriptive of output delay circuit 318. Referring to FIG. 4A, a delay circuit 40A includes a plurality of signal delay components 402A-1 to 402A-6 that are coupled in series. Signal delay components 402A-1 to 402A-6 may be any circuit components providing a certain signal delay, such as inverters. Delay circuit 40A further includes a bypass circuit 402A-S, which is configured to bypass at least one of the signal delay components. Bypass circuit 402A-S includes a switch, and the closed or open position of the switch (bypassing or not bypassing) can be determined by the delay control signal. The switch can, for example, be a transmission gate or a transistor.

A signal delay of delay circuit 40A is determined by the number of the signal delay components bypassed, and the number of signal delay components bypassed is determined by the delay control signal provided by delay control circuit 314. Referring to FIG. 4A, for example, when the delay control signal is "1," the switch is closed, and bypass circuit 402A-S constitutes a short circuit path around signal delay components 402A-3 and 402A-4. In this "bypassing" configuration, an output clock signal is transmitted through four signal delay components (402A-1, 402A-2, 402A-5, and 402A-6) and bypass circuit 402A-S. The output clock signal bypasses signal delay components 402A-3 and 402A-4.

When the delay control signal is "0," the switch of bypass circuit 402A-S is open, and bypass circuit 402A-S does not provide a short circuit path. In this "non-bypassing" configuration, an output clock signal is transmitted through all six signal delay components (402A-1 to 402A-6). The output clock signal does not pass through bypass circuit 402A-S.

In the aforementioned "bypassing" configuration, an output clock signal is transmitted through four signal delay components as opposed to six signal delay components in the "non-bypassing" configuration. Thus, an output clock signal transmitted through the "bypassing" configuration has a shorter delay than an output clock signal transmitted through the "non-bypassing" configuration. Accordingly, by controlling a number of signal delay components bypassed using a delay control signal, a delay of an output clock signal can be modified.

FIG. 4B shows a delay circuit 40B as another exemplary embodiment of delay circuit 308A. Delay circuit 40B includes two signal delay components 402B-1 and 402B-2. Each signal delay component includes two NMOS (NMOS1 and NMOS2) and two PMOS (PMOS1 and PMOS2) transistors. An output clock signal is coupled to gate terminals of the PMOS2 and NMOS2 transistors of signal delay component 402B-1. A bias circuit 404B receives a delay control signal and provides a gate voltage PBIAS to the gate terminal of each PMOS1 transistor, and a gate voltage NBIAS to the gate terminal of each NMOS1 transistor.

A signal delay of delay circuit 40B is determined by controlling gate voltages PBIAS and NBIAS. Gate voltages PBIAS and NBIAS are determined by the delay control signal provided by delay control circuit 314. For example, if the delay control signal includes two binary bits, there can be four different combinations of gate voltages PBIAS and NBIAS applied to the gate terminals of PMOS1 and NMOS1 transistors. By modifying the gate voltages applied to the gate terminals of PMOS1 and NMOS1 transistors, the resistance of PMOS1 and NMOS1 transistors can be changed. Gate voltage PBIAS or NBIAS applied to PMOS1 or NMOS1, respectively, is not so high or so low to cause PMOS1 or NMOS1 to turn off. Accordingly, the time required to charge or discharge an output of signal delay component 402B-1 is modified. Thus, a signal delay of an output clock signal transmitted through signal delay component 402B-1 is modified.

Signal delay component 402B-2 operates in a manner similar to signal delay component 402B-1. Signal delay component 402B-2 receives an output from signal delay component 402B-1, the output being the output clock signal transmitted through signal delay component 402B-1. Signal delay component 402B-2 then provides an output clock feedback signal.

Figure 5:
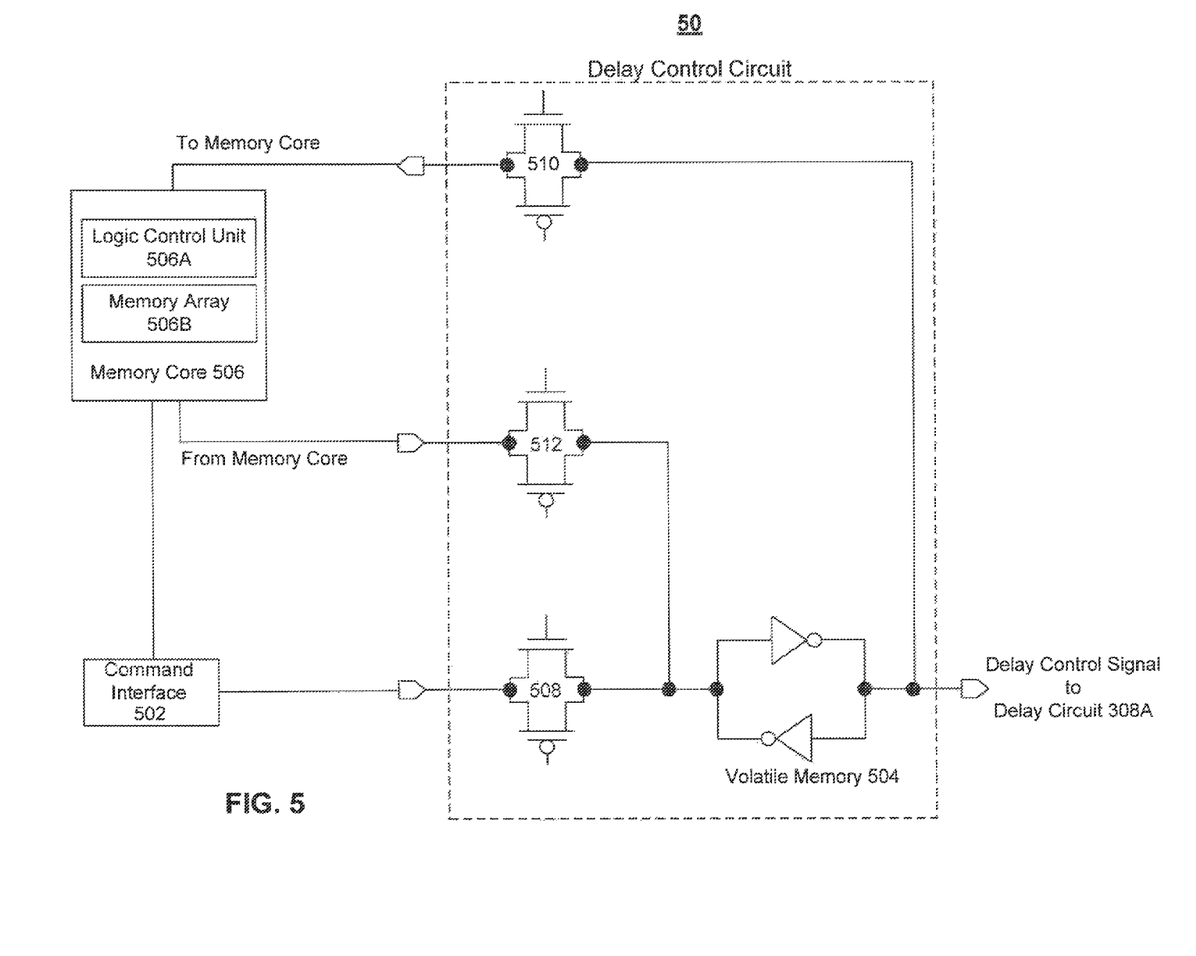
FIG. 5 shows a diagram of an exemplary delay control circuit consistent with embodiments of this disclosure.

FIG. 5 shows a diagram of a delay control circuit 50 as an exemplary embodiment of delay control circuit 314. In some embodiments, delay control circuit 50 is coupled to a command interface 502 to receive a delay control signal provided by a user. Delay control circuit 50 is also coupled to a memory core 506 (being an exemplary embodiment of memory core 302). Memory core 506 includes a logic control unit 506A, a memory array 506B, a row address decoder, a column address decoder, and sense amplifiers (not shown). In addition to storing the data signal described in FIG. 3, memory array 506B may store a delay control signal. For example, memory core 506 may perform a memory write operation for writing (i.e., storing) the delay control signal, which is received from delay control circuit 50, in memory array 506B. Additionally, memory core 506 may perform a memory read operation for accessing the delay control signal from memory array 506B and provide the delay control signal to delay control circuit 50.

In some embodiments, delay control circuit 50 includes a volatile memory 504 for storing a delay control signal. Delay control circuit 50 also includes one or more switches, such as transmission gates. Gate terminals of the transmission gates are coupled to logic control unit 506A (connections not shown), which controls transmission of a delay control signal from command interface 502 to volatile memory 504 or to memory array 506B, and transmission of a delay control signal between volatile memory 504, and memory array 506B by turning the transmission gate(s) on or off during various operations.

For example, transmission gate 508 is coupled to command interface 502 and to volatile memory 504 to control transmission of a delay control signal between command interface 502 and volatile memory 504. Further, a transmission gate 510 is coupled between volatile memory 504 and memory core 506 to control a memory write operation for writing a delay control signal to memory array 506B. The delay control signal to be written in memory array 506B can be stored in volatile memory 504 or provided by command interface 502. Still further, a transmission gate 512 is coupled between volatile memory 504 and memory core 506 to control a loading of the delay control signal from memory array 506B to volatile memory 504 during a power-on or reset (POR) process.

Figure 6:
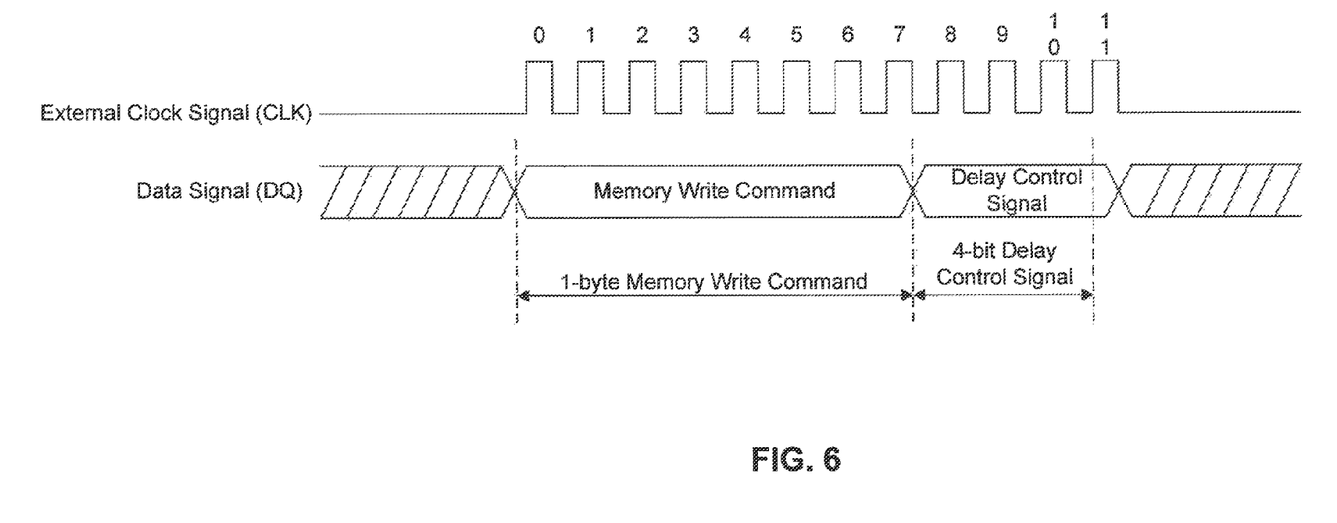
FIG. 6 shows an exemplary memory write command consistent with embodiments of this disclosure.

In some embodiments, command interface 502 receives a memory write command and a delay control signal from a user and provides the command to memory core 506. Based on the memory write command, logic control unit 506A of memory core 506 controls a memory write operation for storing the delay control signal in memory array 506B. Referring to FIG. 6, for example, the memory write command may be a 1-byte (8-bit) instruction followed by the delay control signal, which may be a 4-bit instruction. The number of bits included in the delay control signal depends on the complexity of delay circuit 308A, such as the number of bypass circuits used in delay circuit 308A. A delay circuit including multiple bypass circuits may, for example, be used to provide refined increments of signal delay durations. In an exemplary configuration in which the delay circuit includes the first and second bypass circuits, the first bypass circuit may be configured to bypass one signal delay component, and the second bypass circuit may be configured to bypass two signal delay components. By closing or opening the first and/or second bypass circuits, from zero to up to three signal delay components may be bypassed to modify a delay duration of the output clock signal. The delay control signal can include a plurality of bits to control the multiple bypass circuits.

Figure 7:
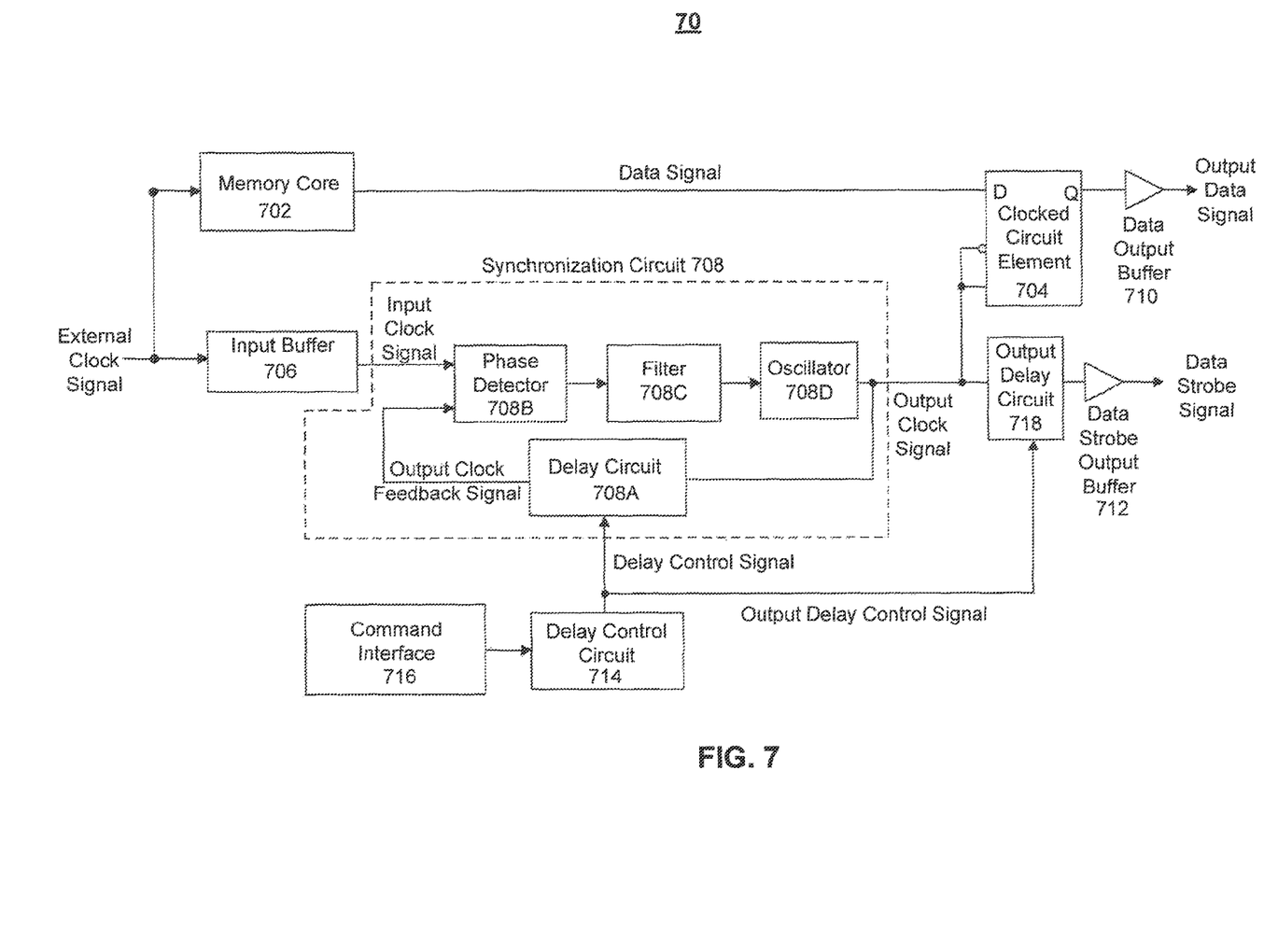
FIG. 7 shows an exemplary non-volatile memory device consistent with embodiments of this disclosure.

FIG. 7 shows an exemplary non-volatile memory device 70 including a memory core 702, a clocked circuit element 704, an input buffer 706, a synchronization circuit 708, a data output buffer 710, a data strobe output buffer 712, and a delay control circuit 714. Memory core 702 includes components performing functions similar to those included in memory core 302.

During a memory read operation, clocked circuit element 704 receives a data signal from memory core 702. Input buffer 706 receives an external clock signal and provides an input clock signal to synchronization circuit 708. Synchronization circuit 708 provides an output clock signal. Clocked circuit element 704 receives the data signal from memory core 702 and the output clock signal from synchronization circuit 708, and provides the data signal to data output buffer 710 at rising and falling edges of the output clock signal. That is, the data signal provided by the clocked circuit element 704 is synchronized with the output clock signal. After receiving the data signal from clocked circuit element 704, data output buffer 710 provides an output data signal corresponding to the data signal received from clocked circuit element 704 and synchronized with the output clock signal. Data strobe output buffer 712 receives the output clock signal from synchronization circuit 708 and provides a data strobe signal synchronized with the output clock signal. Because the data strobe signal and the output data signal are both synchronized to the output clock signal, the data strobe signal indicates that the output data signal is available for a read access.

Synchronization circuit 708 includes a delay circuit 708A, which receives the output clock signal, and provides the output clock feedback signal. Delay circuit 708A also receives a delay control signal provided by delay control circuit 714.

In some embodiments, synchronization circuit 708 further includes a phase detector 708B, a filter 708C, and an oscillator 708D. Phase detector 708B detects a phase difference between the input clock signal and the output clock feedback signal. According to the detected phase difference, phase detector 708B provides a control signal, indicating the detected phase difference, and the input clock signal to filter 708C. Filter 708C filters and limits noise in the input clock signal. Filter 708C provides the control signal and the filtered input clock signal to oscillator 708D. According to the control signal, oscillator 708D removes the phase difference between the filtered input clock signal and the output clock feedback signal by modifying the frequency of the filtered input clock signal, and provides the output clock signal.

In some embodiments, delay circuit 708A receives the delay control signal provided by delay control circuit 714 to modify a delay duration of a data strobe signal. Delay circuit 708A may include circuit components, and perform functions similar to those illustrated in FIGS. 4A and 4B to modify a delay duration of a data strobe signal. In some embodiments, a command interface 716 is coupled to provide a delay control signal to delay control circuit 714. Delay control circuit 714 may include circuit components and perform functions similar to those illustrated in FIGS. 5 and 6. In some embodiments, device 70 further includes an output delay circuit 718 coupled between synchronization circuit 708 and data strobe output buffer 712. Instead of receiving the delay control signal, output delay circuit 718 receives an output delay control signal provided by delay control circuit 714. Output delay circuit 718 and the output delay control signal may be substantially similar to delay circuit 708A and the delay control signal, respectively. Based on the output delay control signal, output delay circuit 718 modifies a delay duration of the data strobe signal relative to the output data signal.

Figure 8:
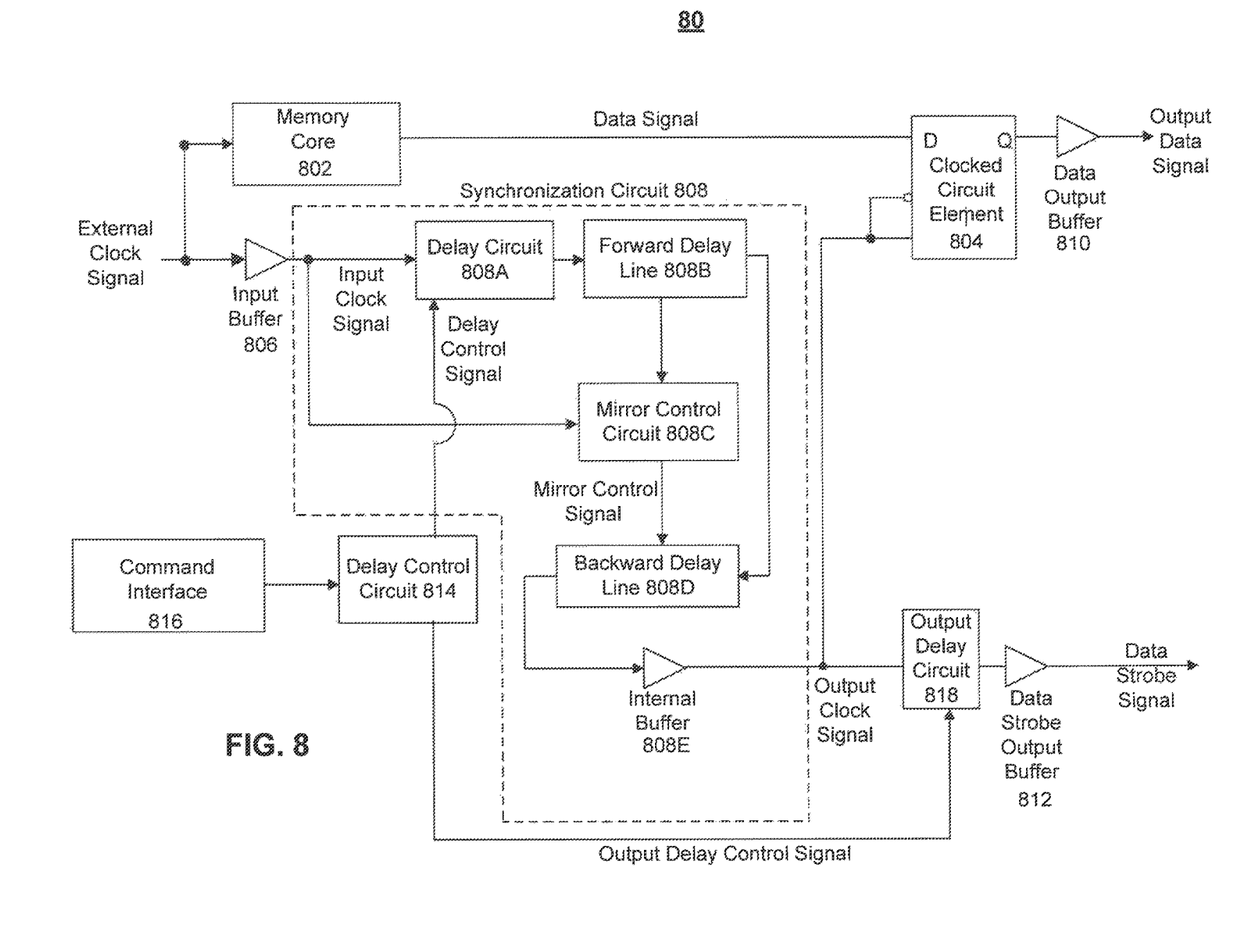
FIG. 8 shows an exemplary non-volatile memory device consistent with embodiments of this disclosure.

FIG. 8 shows an exemplary nonvolatile memory device 80 including a memory core 802, a clocked circuit element 804, an input buffer 806, a synchronization circuit 808, a data output buffer 810, a data strobe output buffer 812, and a delay control circuit 814. Memory core 802 includes components performing functions similar to those included in memory core 302.

During a memory read operation, clocked circuit element 804 receives a data signal from memory core 802. Input buffer 806 receives an external clock signal and provides an input clock signal to synchronization circuit 808. Synchronization circuit 808 provides an output clock signal. Clocked circuit element 804 receives the data signal from memory core 802 and the output clock signal from synchronization circuit 808 and provides the data signal to data output buffer 810 at rising and falling edges of the output clock signal. Data output buffer 810 receives the data signal from clocked circuit element 804, and provides an output data signal corresponding to the data signal received from clocked circuit element 804. Data strobe output buffer 812 receives the output clock signal from synchronization circuit 808, and provides a data strobe signal.

Synchronization circuit 808 includes a delay circuit 808A, which receives the input clock signal provided by input buffer 806 and a delay control signal provided by delay control circuit 814. In some embodiments, synchronization circuit 808 further includes a forward delay line 808B, a mirror control circuit 808C, a backward delay line 808D, and an internal buffer 808E. Delay circuit 808A receives the input clock signal provided by input buffer 806 and provides the input clock signal to forward delay line 808B. Forward delay line 808B receives the input clock signal and provides it to mirror control circuit 808C and backward delay line 808D. Mirror control circuit 808C receives the input clock signal from forward delay line 808B and the input clock signal from input buffer 806, determines a phase difference between the input clock signals received from forward delay line 808B and input buffer 806, and provides a mirror control signal to backward delay line 808D.

The mirror control signal controls a delay length of backward delay line 808D to match a delay length of forward delay line 808B. For example, backward delay line 808D can include a plurality of signal delay components (e.g., 402B-1 and 402B-2 of FIG. 4B) that are controlled by the mirror control signal to match the delay length of forward delay line 808B. Internal buffer 808E receives the input clock signal provided by backward delay line 808D and provides the output clock signal to clocked circuit element 804. Internal buffer 808E also provides the output clock signal to data strobe output buffer 812. Clocked circuit element 804 then provides the data signal to data output buffer 810 at the rising and falling edges of the output clock signal. That is, the data signal provided by the clocked circuit element 804 is synchronized with the output clock signal. After receiving the data signal from clocked circuit element 804, data output buffer 810 provides the output data signal corresponding to the data signal received from clocked circuit element 804 and synchronized with the output clock signal. Data strobe output buffer 812 receives the output clock signal from internal buffer 808E and provides the data strobe signal synchronized with the output clock signal. Because the data strobe signal and the output data signal are both synchronized to the output clock signal, the data strobe signal indicates that the output data signal is available for a read access.

In some embodiments, a signal delay of delay circuit 808A is determined by the delay control signal provided by delay control circuit 814. Delay circuit 808A receives the delay control signal provided by delay control circuit 814 to modify a delay duration of the data strobe signal. Delay circuit 808A may include circuit components, and perform functions similar to those illustrated in FIGS. 4A and 4B to modify the delay duration of the data strobe signal. In some embodiments, a command interface 816 is coupled to delay control circuit 814 and provides a delay control signal to delay control circuit 814. Delay control circuit 814 can include circuit components and perform functions similar to those illustrated in FIGS. 5 and 6.

Each of forward delay line 808B and backward delay line 808D can include a plurality of signal delay components. Signal delays of forward delay line 808B and backward delay line 808D are determined and matched (mirrored) by mirror control circuit 808C.

When the external clock signal is transmitted through input buffer 806 and synchronization circuit 808, the external clock signal accumulates delay. For example, it is assumed that input buffer 806 and circuit components in synchronization circuit 808 have the following signal delay durations: input buffer 806=d1; delay circuit 808A=d1+d2±d3, where d3 is a delay duration that may be modified according to the delay control signal provided by delay control circuit 814; forward delay line 808B=tclk−(d1+d2), where tclk is a duration of a full clock cycle of the external clock signal; backward delay line 808D=tclk−(d1+d2), and internal buffer 808E=d2. The accumulated delay for the external clock signal transmitted through input buffer 806 and synchronization circuit 808 is equal to the sum of the above-mentioned signal delay durations, which is equal to 2×tclk±d3. In other words, the output clock signal provided by synchronization circuit 808, has a delay of 2×tclk±d3 added to the external clock signal. As discussed above, d3 is a delay duration of delay circuit 808A that may be modified according to the delay control signal provided by delay control circuit 814. Because the delay duration d3 is also a part of delay in the data strobe signal, the delay duration of the data strobe signal may be modified according to the delay control signal.

The exemplary memory device 80 enables adjusting a delay duration of the data strobe signal, and to compensate for various factors that affect the delay duration of the data strobe signal, such as operating temperature, operating voltage, and fabrication processes. In some embodiments, device 80 further includes an output delay circuit 818 in FIG. 8 coupled between synchronization circuit 808 and data strobe output buffer 812. Instead of receiving the delay control signal, output delay circuit 818 receives an output delay control signal provided by delay control circuit 814. Output delay circuit 818 and the output delay control signal may be substantially similar to delay circuit 808A and the delay control signal, respectively. Based on the output delay control signal, output delay circuit 818 modifies a delay duration of the data strobe signal relative to the output data signal.

While the present invention has been described in connection with various embodiments, other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A non-volatile memory device, comprising:
   a memory core to store data, the data being output from the memory core according to an external clock signal;
   an input buffer to receive the external clock signal and to provide an input clock signal;
   a synchronization circuit to receive the input clock signal and to provide an output clock signal, the synchronization circuit synchronizing the output clock signal to the external clock signal, the synchronization circuit including a delay circuit;
   a data strobe output buffer to receive the output clock signal and to provide a data strobe signal indicating the data output from the memory core is available for access, the data strobe signal having a signal delay configurable relative to the external clock signal;
   a clocked circuit element coupled to the memory core to receive the data output from the memory core and the output clock signal and to output the data in synchronism with the output clock signal; and
   a delay control circuit to provide a delay control signal to the delay circuit, the delay circuit being responsive to the delay control signal, to modify the signal delay of the data strobe signal.

2. The non-volatile memory device according to claim 1, wherein the delay circuit includes
   a plurality of signal delay components; and
   a bypass circuit to bypass at least one of the plurality of signal delay components to modify the signal delay relative to the external clock signal, wherein the signal delay is determined by a number of the signal delay components bypassed, the number of bypassed signal delay components being determined by the delay control signal.

3. The non-volatile memory device according to claim 1, wherein the delay circuit includes
   a plurality of signal delay components each adjusted according to the delay control signal to modify the signal delay.

4. The non-volatile memory device according to claim 1, wherein the delay control circuit is configured to provide an output delay control signal, the non-volatile memory device further including an output delay circuit responsive to the output delay control signal to modify a signal delay of the data strobe signal relative to the data.

5. The non-volatile memory device according to claim 1, wherein the delay control circuit includes
a volatile memory for storing the delay control signal.

6. The non-volatile memory device according to claim 5, wherein the memory core includes
a memory array to store the delay control signal and;
a logic control unit to control a loading, from the memory array, of the stored delay control signal into the volatile memory during a power-on or reset (POR) process.

7. The non-volatile memory device according to claim 5, wherein the delay control circuit is coupled to a command interface to receive the delay control signal.

8. The non-volatile memory device according to claim 6, wherein the delay control circuit is coupled to a command interface to receive the delay control signal and a memory write command to store the delay control signal.

9. The non-volatile memory device according to claim 1, wherein the delay circuit is coupled to receive the output clock signal and to provide an output clock feedback signal; the synchronization circuit further including:
a phase detector to receive the output clock feedback signal and the input clock signal, and to determine a phase difference between the output clock feedback signal and the input clock signal; and
a shift register, controlled by the phase detector, to determine a delay length of a delay line, the delay line coupled to receive the input clock signal and to provide the output clock signal.

10. The non-volatile memory device according to claim 1, wherein the delay circuit is coupled to receive the output clock signal and to provide an output clock feedback signal; the synchronization circuit further including:
a phase detector to receive the output clock feedback signal and the input clock signal, and to determine a phase difference between the output clock feedback signal and the input clock signal;
an oscillator, controlled by the phase detector, to provide the output clock signal; and
a filter, coupled to the phase detector and the oscillator, to limit noise in the input clock signal.

11. The non-volatile memory device according to claim 1, wherein
the input buffer has a first delay length; and
the delay circuit has a second delay length and a configurable delay length, the configurable delay length being modified according to the delay control signal;
the synchronization circuit further including:
a forward delay line having a third delay length;
a backward delay line having a fourth delay length;
a mirror control circuit to match the fourth delay length to the third delay length; and
an internal buffer having a fifth delay length, wherein a sum of the first, second, third, fourth, and fifth delay lengths is an integer multiple of a duration of a full clock cycle of the external clock signal.

12. The non-volatile memory device according to claim 1, wherein the delay circuit is coupled to receive the input clock signal provided by the input buffer.

13. The non-volatile memory device according to claim 1, wherein the memory core is a flash memory.

14. A circuit to synchronize clock signals, comprising:
a synchronization circuit to receive an input clock signal and to provide an output clock signal, the synchronization circuit synchronizing the output clock signal to an external clock signal, the synchronization circuit including a delay circuit;
a strobe output buffer to receive the output clock signal and to provide a strobe signal, the strobe signal having a signal delay configurable relative to the external clock signal; and
a delay control circuit to provide a delay control signal to the delay circuit, the delay circuit being responsive to the delay control signal, to modify the signal delay of the strobe signal.

15. The circuit according to claim 14, wherein the synchronization circuit further includes
a delay line to receive the input clock signal and to provide the output clock signal;
a shift register, coupled to the delay line, to determine a delay length of the delay line;
a phase detector to control the shift register; and
a feedback loop including the delay circuit, the feedback loop coupled to the delay line and the phase detector.

16. The circuit according to claim 14, wherein the delay circuit is coupled to receive the output clock signal and to provide an output clock feedback signal;
the synchronization circuit further including:
a phase detector to receive the output clock feedback signal and the input clock signal, and to determine a phase difference between the output clock feedback signal and the input clock signal;
an oscillator, controlled by the phase detector, to provide the output clock signal; and
a filter, coupled to the phase detector and the oscillator, to limit noise in the input clock signal.

17. A circuit to synchronize clock signals, comprising:
an input buffer to receive an external clock signal and to provide an input clock signal, the input buffer having a first delay length;
a synchronization circuit to receive the input clock signal and to provide an output clock signal, the synchronization circuit synchronizing the output clock signal to the external clock signal, the synchronization circuit including:
a delay circuit having a second delay length and a configurable delay length,
a forward delay line having a third delay length,
a backward delay line having a fourth delay length,
a mirror control circuit to match the fourth delay length to the third delay length, and
an internal buffer having a fifth delay length, wherein a sum of the first, second, third, fourth, and fifth delay lengths is an integer multiple of a duration of a full clock cycle of the external clock signal;
a strobe output buffer to receive the output clock signal and to provide a strobe signal, the strobe signal having a signal delay configurable relative to the external clock signal; and
a delay control circuit to provide a delay control signal to the delay circuit of the synchronization circuit, the delay circuit being responsive to the delay control signal to adjust the configurable delay length of the delay circuit, to modify the signal delay of the strobe signal.

18. A method for configuring a signal delay in a non-volatile memory device, comprising:
receiving an external clock signal;
providing a data strobe signal indicating data stored in the non-volatile memory is available for access, the data strobe signal having a signal delay configurable relative to the external clock signal; and providing a memory operation command to the non-volatile memory device to modify the signal delay.

19. The method according to claim 18, wherein providing the memory operation command includes:

providing a memory write command; and providing a delay control signal to modify the signal delay of the data strobe signal.

* * * * *